United States Patent
Skotnicki et al.

(10) Patent No.: US 6,583,451 B2
(45) Date of Patent: Jun. 24, 2003

(54) PROCESS FOR FABRICATING A NETWORK OF NANOMETRIC LINES MADE OF SINGLE-CRYSTAL SILICON AND DEVICE OBTAINED

(75) Inventors: Thomas Skotnicki, Crolles Montfort (FR); Malgorzata Jurczak, Grenoble (FR); Didier Dutartre, Meylan (FR)

(73) Assignee: STMicroelectronics S.A., Gentilly (FR)

(*) Notice: Subject to any disclaimer, the term of this patent is extended or adjusted under 35 U.S.C. 154(b) by 19 days.

(21) Appl. No.: 09/738,870

(22) Filed: Dec. 15, 2000

(65) Prior Publication Data

US 2001/0005618 A1 Jun. 28, 2001

(30) Foreign Application Priority Data

Dec. 16, 1999 (FR) ............................................. 99 15902

(51) Int. Cl.[7] .............................................. H01L 33/00
(52) U.S. Cl. .................... 257/103; 257/29.07; 438/479; 438/149; 438/481
(58) Field of Search ................................. 438/144, 353, 438/357, 360, 413, 718, 714, 738, 479, 149, 481; 257/103, 3, 14, 734, 15, 647, 29.07; 372/43, 48

(56) References Cited

U.S. PATENT DOCUMENTS

| | | | |
|---|---|---|---|
| 4,987,094 A | * | 1/1991 | Colas et al. ................. 438/144 |
| 5,212,110 A | * | 5/1993 | Pfiester et al. .............. 438/427 |
| 5,262,348 A | * | 11/1993 | Pribat et al. ................. 438/604 |
| 5,630,905 A | * | 5/1997 | Lynch et al. ................. 438/507 |
| 5,705,321 A | * | 1/1998 | Brueck et al. ............... 430/316 |
| 5,746,826 A | * | 5/1998 | Hasegawa et al. ............ 117/90 |
| 6,103,540 A | * | 8/2000 | Russell et al. ................ 438/22 |
| 6,110,278 A | * | 8/2000 | Saxena ......................... 117/95 |

FOREIGN PATENT DOCUMENTS

| | | | |
|---|---|---|---|
| EP | 0661733 A2 | * 5/1995 | |
| EP | 0 661 733 | 7/1995 | ......... H01L/21/335 |
| EP | 0 951 055 | 10/1999 | ........... H01L/21/20 |
| FR | 2 741 195 | 5/1997 | ....... H01L/31/0352 |
| JP | 02122682 | * 5/1990 | ................... 372/45 |

OTHER PUBLICATIONS

O.G. Schmidt, et al. "Free–standing SiGe–based nanopipelines on Si(001) substrates" Applied Physics Letters vol. 78, No. 21 (May 2001).*

Patent Abstracts of Japan, vol. 008, No. 131—Jun. 19, 1984—"Forming Method of Fine Pattern"; Inventor: Yamauchi Yoshiharu.

Proceedings of the European Solid State Device Research Conference 1998, XP–000949963—"Investigation on the Suitability of Vertical MOSFET's for High Speed (RF) CMOS Applications"; Jurczak M. et al. p. 174.

* cited by examiner

*Primary Examiner*—Caridad Everhart
(74) *Attorney, Agent, or Firm*—Lisa K. Jorgenson; Allen, Dyer, Doppelt, Milbrath & Gilchrist, P.A.

(57) ABSTRACT

The process for fabricating a network of nanometric lines made of single-crystal silicon on an isolating substrate includes the production of a substrate comprising a silicon body having a lateral isolation defining a central part in the body. A recess is formed in the central part having a bottom wall made of dielectric material, a first pair of opposed parallel sidewalls made of dielectric material, and a second pair of opposed parallel sidewalls. At least one of the opposed parallel sidewalls of the second pair being formed from single-crystal silicon. The method further includes the epitaxial growth in the recess, from the sidewall made of single-crystal silicon of the recess, of an alternating network of parallel lines made of single-crystal SiGe alloy and of single-crystal silicon. Also, the lines made of single-crystal SiGe alloy are etched to form in the recess a network of parallel lines made of single-crystal silicon insulated from each other.

25 Claims, 3 Drawing Sheets

PROCESS FOR FABRICATING A NETWORK OF NANOMETRIC LINES MADE OF SINGLE-CRYSTAL SILICON AND DEVICE OBTAINED

FIELD OF THE INVENTION

The present invention generally relates to semiconductor manufacturing, and, more particularly to processes for fabricating a network of nanometric lines made of single-crystal silicon on an insulating substrate.

BACKGROUND OF THE INVENTION

A network of lines made of single-crystal silicon on an insulating substrate may be a very promising structure for applications in the fabrication of transistors, memories, optoelectronic devices and others. A network of lines made of single-crystal silicon on an insulating substrate may be obtained, of course, by photolithography and etching of a substrate of the SOI (silicon on insulator) type. However, this approach can only provide lines and interline spacings within the resolution limit of the photolithography process. Photolithography processes provide, at the very best, lines having a width of 100 nanometers or more to be obtained.

It would therefore be desirable to have available a process for making lines made of single-crystal silicon of very small width, in particular less than 100 nanometers, to be obtained, so as to increase the integration of the devices obtained and also to promote mechanical and optoelectronic transport effects.

SUMMARY OF THE INVENTION

A feature of the present invention is therefore a process for fabricating a network of nanometric lines made of single-crystal silicon on an insulating substrate, and in particular of parallel nanometric lines of a width less than 100 nanometers.

According to the invention, the process for fabricating a network of nanometric lines made of single-crystal silicon on an insulating substrate includes: (a) the production of a substrate comprising a single-crystal silicon body, a lateral isolation defining a central part in the body, a recess formed in the central part having a bottom wall made of dielectric material, preferably $SiO_2$, a first pair of opposed parallel sidewalls made of dielectric material, preferably $SiO_2$, and a second pair of opposed parallel sidewalls, at least one of the sidewalls of the second pair being formed from single-crystal silicon; (b) the epitaxial growth in the recess, from the sidewall made of single-crystal silicon of the recess, of an alternating network of parallel lines made of single-crystal SiGe alloy and of single-crystal silicon; and (c) the etching of the lines made of single-crystal SiGe alloy, to form in the recess a network of parallel lines made of single-crystal silicon insulated from each other.

Use of the epitaxial growth technique to construct the lines of the structure according to the invention makes it possible to chose, virtually as required, the fineness of the lines. Furthermore, the use of the etching selectivity between the SiGe alloy and silicon allows the network of single-crystal silicon lines to be constructed on the insulating substrate having well-defined dimensions and virtually any fineness required by the designer.

Another major advantage of the process of the invention is that it can be implemented either from a solid single-crystal silicon substrate or from a conventional so-called SOI (Silicon On Insulator) substrate.

In an alternative embodiment of the invention, the opposed parallel sidewalls of the second pair of sidewalls of the recess formed in the central part of the silicon body of the substrate are formed by single-crystal silicon and the epitaxial growth of the alternating network of parallel lines made of single-crystal SiGe alloy and of lines made of single-crystal silicon is carried out from these two opposed parallel sidewalls.

Preferably, the width (fineness) of the alternating lines of the network is from 5 to 20 nanometers.

Because of the use of epitaxial growth to form the network of alternating lines, it is possible to choose, as required, the periodicity of the lines made of single-crystal silicon and of the interline spaces, as well as their width. However, care should be taken not to exceed the critical thicknesses (known to those skilled in the art), to avoid the risk of impairing the stress relaxation of the layers.

In a first embodiment of the invention, the substrate of step (a) is obtained from a solid substrate made of single-crystal silicon comprising a lateral isolation defining a central part of the solid substrate; masking and etching of the central part to form therein a recess having a bottom wall, a first pair of opposed parallel sidewalls made of dielectric material and a second pair of opposed parallel sidewalls, at least one of the walls of which is formed by single-crystal silicon; treatment of the bottom wall of the recess to increase the silicon oxidation rate therein; formation, on the bottom wall and the opposed parallel sidewalls of the second pair, of a silicon oxide layer which is thicker on the bottom wall than on the opposed sidewalls; and isotropic etching of the silicon oxide in order to remove the silicon oxide layer from the opposed parallel sidewalls of the second pair, while leaving a silicon oxide layer on the bottom wall of the recess.

In a second embodiment of the invention, the substrate of step (a) is obtained from a so-called SOI substrate including: a stack of a lower layer made of single-crystal silicon, a silicon oxide interlayer and an upper layer comprising a central part made of single-crystal silicon bounded by a lateral isolation; the formation on the upper layer of a thin silicon oxide layer; the formation on the thin silicon oxide layer of a mask; the etching through the mask of the thin silicon oxide layer and of the central part of the upper layer of the SOI substrate, stopping on the silicon oxide interlayer, so as to form a recess having a bottom wall made of silicon oxide, a first pair of opposed parallel sidewalls made of dielectric material and a second pair of opposed parallel sidewalls, at least one of which is formed from single-crystal silicon; and the removal of the mask.

Preferably, the opposed parallel sidewalls made of dielectric material of the first pair of sidewalls are formed by walls of the lateral isolation, generally made of silicon oxide ($SiO_2$) Preferably, when one of the sidewalls of the second pair of sidewalls is not made of single-crystal silicon, this sidewall is formed by a wall of the lateral isolation, generally made of silicon oxide ($SiO_2$).

The present invention also relates to a device comprising a substrate having a single-crystal silicon body and a lateral isolation defining in the body a central part. The central part comprises a recess. This device includes, in the recess, a network of parallel lines made of single-crystal silicon, which lines are spaced apart and insulated from each other. Preferably, these single-crystal silicon lines lie on a bottom wall, made of dielectric material such as $SiO_2$, of the recess. Preferably, also, the single-crystal silicon lines are buried with respect to the upper surface of the single-crystal silicon body, i.e. the upper surfaces of these lines lie in the plane of the upper surface of the single-crystal silicon body or below this surface.

The spaces between the single-crystal silicon lines may be formed from a gaseous dielectric material such as air or from a solid dielectric material such as, for example, $SiO_2$ or $Si_3N_4$. The width of the single-crystal silicon lines and of the interline spaces is generally from 5 to 20 nanometers.

BRIEF DESCRIPTION OF THE DRAWINGS

The rest of the description refers to the appended figures which show respectively.

DETAILED DESCRIPTION OF THE PREFERRED EMBODIMENTS

Figure 1A:
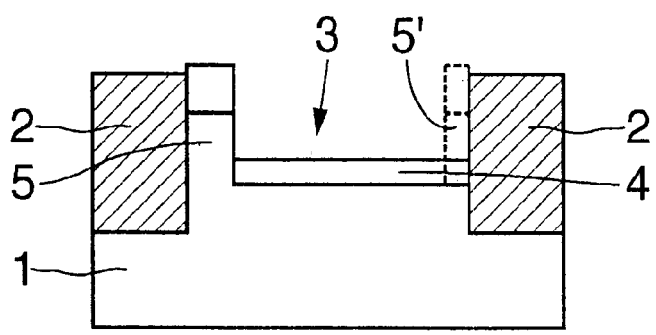
FIGS. 1a to 1c are cross-sectional views illustrating the main steps of the process for fabricating the network of nanometric lines made of single-crystal silicon according to the invention.
Figure 1B:
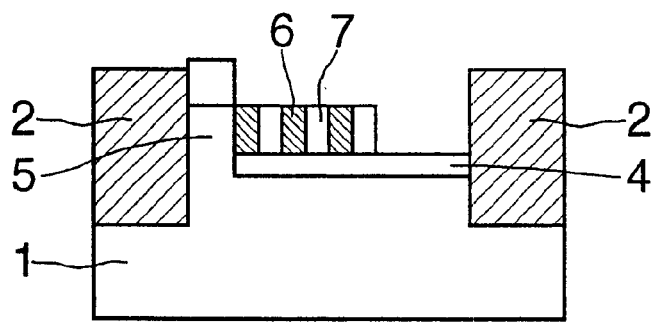
Figure 1C:
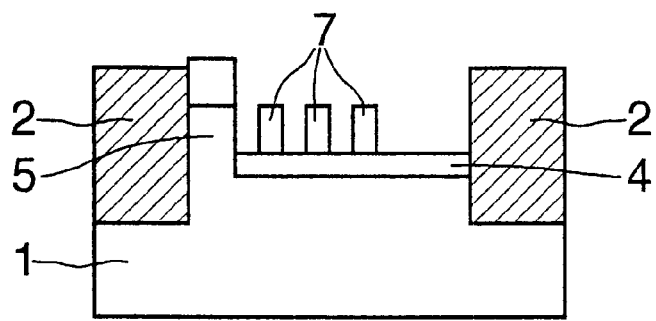

The steps in the fabrication of a network of nanometric lines made of single-crystal silicon on an insulating substrate according to the invention are shown with reference to the figures, and in particular to FIGS. 1a to 1c.

As shown in FIG. 1a, the first step includes obtaining a substrate having a single-crystal silicon body 1 and a lateral isolation 2 defining a central part in the body. As is well known, the lateral isolation 2 generally defines a parallel-epipedal central part. This central part is provided with a recess 3, generally of parallelepipedal shape, having a horizontal bottom wall and vertical sidewalls. The bottom wall of the recess 3 is coated with a silicon oxide layer 4. A sidewall of the recess 3 is defined by a single-crystal silicon layer 5, whereas the opposite vertical sidewall may be formed by a wall of the lateral isolation 2 or by a vertical layer 5' (shown in dotted lines in FIG. 1a) similar to the layer 5. The vertical layer 5 and possibly the vertical single-crystal silicon layer 5' are coated generally on their upper surface with a thin silicon oxide layer. The two other opposed sidewalls of the recess are formed from a dielectric material and preferably by a wall of the lateral isolation 2.

The next step, as shown in FIG. 1b, is the epitaxial growth, from the vertical sidewall made of single-crystal silicon 5, of parallel lines alternating between a silicon and germanium alloy 6 and single-crystal silicon 7 in the recess 3 on the silicon oxide layer 4. Any conventional process can be used for the epitaxial growth of the alternating lines. Naturally, depending on the epitaxial growth conditions, both the width of the lines and the pitch of the alternating lines can be adjusted. This formation of alternating lines can be made to fill the recess 3 partially or completely.

The silicon/germanium alloys used in the present invention are well known. Among these alloys, mention may be made of the alloys $Si_{1-x}Ge_x$ where $0<x<1$ and the alloys $Si_{1-x-y}Ge_xC_y$ where $0<x \leq 0.95$ and $0<y \leq 0.5$. Preferably, to facilitate the selective etching of SiGe alloys having a relatively high germanium content, preferably alloys for which $x \geq 0.1$, for example $0.1 \leq x \leq 0.3$, will be chosen.

The final step of the process include selective etching of the SiGe alloy lines, either by isotropic plasma etching or by etching using a well-known oxidizing chemistry. By way of example, a selective etching solution such as a solution of 40 ml 70% $HNO_3$+1 ml $H_2O_2$+5 ml 0.5% HF can be used.

SiGe alloys and their selective etching are described in French Patent 99/03470.

The substrate described in FIG. 1a may, as previously indicated, be obtained either from a conventional solid single-crystal silicon substrate or from a conventional so-called SOI (Silicon On Insulator) substrate.

FIGS. 2a to 2e show the main steps for obtaining a substrate as shown in FIG. 1a from a conventional solid single-crystal silicon substrate. As is well known, the conventional solid single-crystal silicon substrate comprises a single-crystal silicon body 1 and a lateral isolation (STI) defining a central part in the body.

Figure 2A:
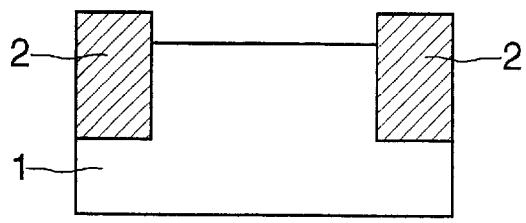
FIGS. 2a to 2e are cross-sectional views illustrating the main steps of a process for obtaining a substrate corresponding to the substrate of FIG. 1a starting from a solid substrate made of silicon.
Figure 2B:
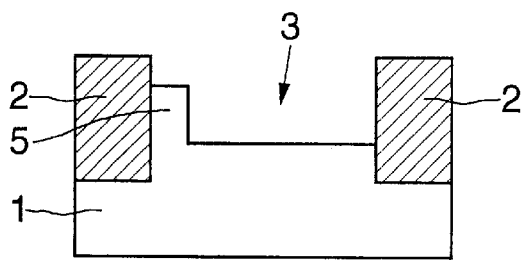

As FIG. 2b shows, the process starts by conventionally forming, via a mask and by etching, a recess 3 in the central part of the single-crystal silicon body 1 so as to leave, on a wall of the isolation 2 bounding the central part, a single-crystal silicon part 5. The opposed parallel sidewall of the recess may be made either directly as shown in FIG. 2b by the lateral isolation 2 or by a silicon part similar to the part 5.

Figure 2C:
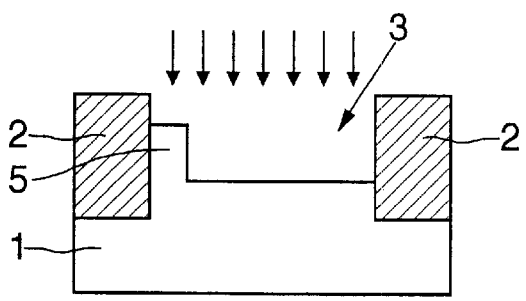

Next, as shown in FIG. 2c, the bottom wall of the recess 3 is then treated to modify this single-crystal silicon bottom wall and provide it with a higher oxidation rate than the single-crystal silicon vertical part 5 forming one of the sidewalls of the recess 3. This treatment may advantageously be a high-dose implantation of an appropriate element or compound. Among appropriate elements promoting the oxidation rate of single-crystal silicon, mention may be made of silicon, indium and arsenic. Among compounds, boron fluoride $BF_2$ may be mentioned. This implantation is carried out perpendicularly to the bottom wall of the recess 3 so that only the latter, and not the vertical wall 5 of the recess, is modified.

This process for modifying the oxide growth rate of a single-crystal silicon surface is known and is described, for example, in the article by M. JURCZAK et al. "Investigation on the suitability of vertical MOSFET's for high speed (RF) CMOS applications", ESSDERC Proceedings 1998, pp. 172–175, Editions Frontières, Bordeaux 1998.

Figure 2D:
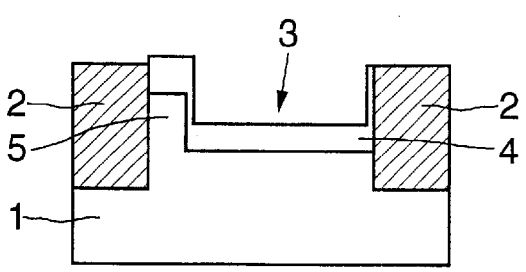
Figure 2E:
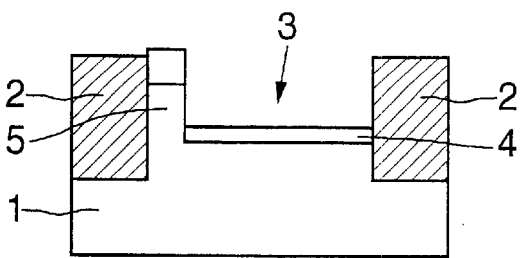

The structure obtained at step 2c is then subjected to a conventional oxidation as shown in FIG. 2d in order to form, on the bottom wall and on the sidewalls of the recess 3, a silicon oxide layer 4. Because of the previous treatment, the layer thus formed is thicker on the bottom wall of the recess than on the sidewalls of the recess, and in particular thicker than on the untreated single-crystal silicon wall 5 and on the opposed sidewall of the recess. Of course, the upper surface of the single-crystal silicon sidewall 5 is also covered with a silicon oxide layer with a thickness similar to that covering the bottom wall of the recess, since this surface is also treated during the previous treatment.

Next follows the removal by etching, for example conventional chemical etching, of the silicon oxide layer covering the opposed sidewalls of the recess. Given that the silicon oxide layer 4 covering the bottom wall of the recess 3 is thicker than that covering the opposed sidewalls of this recess, the etching step makes it possible to expose the opposed sidewalls of the recess and in particular the wall formed by the single-crystal silicon part 5, while keeping a silicon oxide layer on the bottom wall of the recess, and thus to obtain the substrate as shown in FIG. 1a.

Figure 3A:
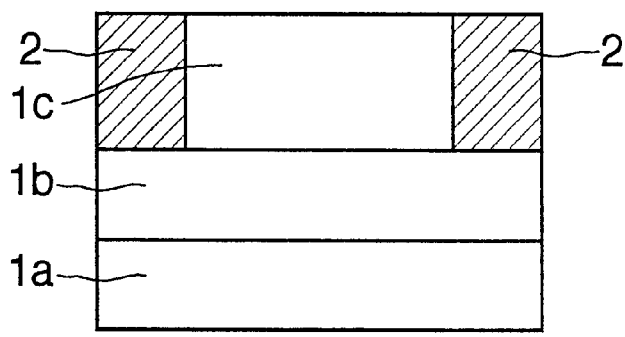
FIGS. 3a to 3c are cross-sectional views illustrating the main steps of a process for obtaining a substrate similar to that of FIG. 1a starting from a conventional SOI substrate.

With reference to FIGS. to 3a to 3c, the production of a substrate as shown in FIG. 1a from a conventional so-called SOI substrate, will now be described. As shown in FIG. 3a, the conventional SOI substrate comprises a stack of a lower single-crystal silicon layer 1a, an silicon oxide interlayer 1b and an upper layer formed by a central single-crystal silicon part 1c bounded by a lateral isolation 2. Initially, a thin silicon oxide layer 8 is formed on the upper layer, then a resin mask 9 is formed on this silicon layer.

Figure 3B:
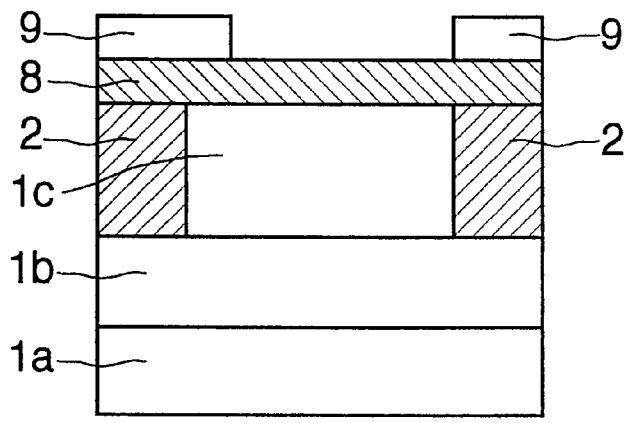
Figure 3C:
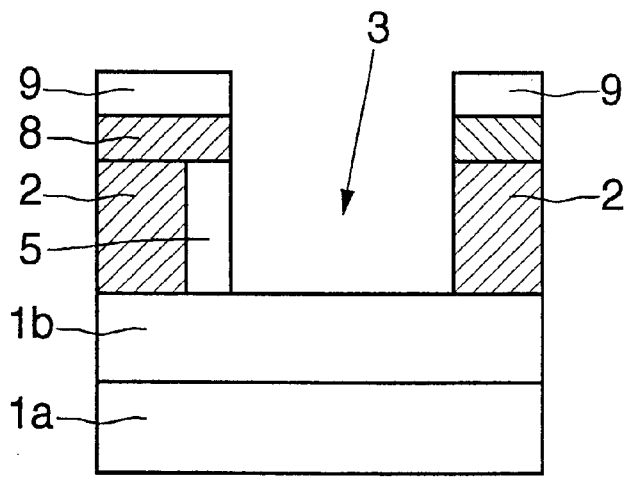

As shown in FIG. 3b, the mask 9 has an opening which is off-centred with respect to the central part 1c, so as to cover a portion of the central single-crystal silicon part 1c adjacent to a sidewall of the isolation 2. Next, the etching of the thin silicon oxide layer 8 and of the central single-crystal silicon part 1c are carried out via the mask, the etching stopping on the silicon oxide interlayer 1b, to form a recess 3 whose bottom wall is formed by silicon oxide (the silicon oxide of the interlayer 1b) and two opposed sidewalls of which are formed, one by the unetched single-crystal silicon part 5 since it is under a part of the mask 9 and the other by the lateral isolation 2. After conventional removal of the mask 9, a substrate similar to that described in connection with FIG. 1a is obtained.

Of course, in the processes described in connection with FIGS. 2a to 2e and 3a to 3c, it is also possible to construct two opposed sidewalls of the recess 3 which are formed from single-crystal silicon by providing an etching mask of the appropriate shape.

What is claimed is:

1. A method for fabricating a network of nanometric lines made of single-crystal silicon on an insulating substrate, comprising:

producing a substrate comprising a silicon body, a lateral isolation region defining a central part in the body, a recess formed in the central part having a bottom wall of a dielectric material, a first pair of opposed parallel sidewalls of the dielectric material, and a second pair of opposed parallel sidewalls, at least one of the opposed parallel sidewalls of the second pair being formed from single-crystal silicon;

epitaxially growing in the recess, from the at least one opposed sidewall made from single-crystal silicon of the recess, an alternating network of single-crystal SiGe alloy parallel lines and single-crystal silicon parallel lines; and etching the single-crystal SiGe alloy lines, to form in the recess, a network of single-crystal silicon parallel lines insulated from each other.

2. A method according to claim 1, wherein the two opposed parallel sidewalls of the second pair of sidewalls of the recess are formed from single-crystal silicon and the epitaxial growth of the alternating lines is carried out from the two opposed parallel sidewalls made of single-crystal silicon.

3. A method according to claim 1 wherein each of the alternating lines has a width less than 100 nm.

4. A method according to claim 3 wherein each of the alternating lines has a width of 5 to 20 nm.

5. A method according to claim 1 wherein the production of the substrate comprises:

forming a solid substrate made of single-crystal silicon having the lateral isolation region defining the central part of the solid substrate;

masking and etching the central part to form the recess therein having the bottom wall, the first pair of opposed parallel sidewalls, and the second pair of opposed parallel sidewalls;

treating the bottom wall of the recess to increase the silicon oxidation rate thereof;

forming, on the bottom wall and the opposed parallel sidewalls of the second pair, a silicon oxide layer which is thicker on the bottom wall than on the opposed sidewalls; and isotropically etching the silicon oxide layer to remove the silicon oxide layer from the opposed parallel sidewalls of the second pair, while leaving the silicon oxide layer on the bottom wall of the recess.

6. A method according to claim 5 wherein treating the bottom wall comprises vertically implanting a high dose of one of an element and a compound which accelerates the oxidation of the single-crystal silicon.

7. A method according to claim 6 wherein the element comprises one of Si, In and As, and the compound comprises $BF_2$.

8. A method according to claim 1 wherein production of the substrate comprises:

forming a SOI substrate comprising a stack inducting a lower layer of single-crystal silicon, a silicon oxide interlayer, and an upper layer having the central part of single-crystal silicon bounded by the lateral isolation region;

forming a thin silicon oxide layer on the upper layer;

forming a mask on the thin silicon oxide layer;

etching, via the mask, the thin silicon oxide layer and the central part of the upper layer of the SOI substrate, stopping on the silicon oxide interlayer, to form the recess having the bottom wall made of silicon oxide, the first pair of opposed parallel sidewalls, and the second pair of opposed parallel sidewalls; and removing the mask.

9. A method for making a semiconductor device comprising:

providing a substrate comprising a silicon body, a lateral isolation region defining a central part in the body, a recess formed in the central part having a dielectric bottom, a first pair of opposed parallel dielectric sidewalls, and a second pair of opposed parallel sidewalls, at least one of the opposed parallel sidewalls of the second pair being formed from single-crystal silicon;

epitaxially growing an alternating network of single-crystal SiGe alloy parallel lines and single-crystal silicon parallel lines in the recess from the at least one opposed sidewall made from single-crystal silicon; and etching the single-crystal SiGe alloy lines to form a network of single-crystal silicon parallel lines insulated from each other in the recess.

10. A method according to claim 9, wherein both of the opposed parallel sidewalls of the second pair are formed from single-crystal silicon, and the epitaxial growth of the alternating lines is carried out from the two opposed parallel sidewalls made of single-crystal silicon.

11. A method according to claim 9 wherein each of the alternating lines has a width less than 100 nm.

12. A method according to claim 9 wherein each of the alternating lines has a width of 5 to 20 nm.

13. A method according to claim 9 wherein providing the substrate comprises:

forming a solid substrate made of single-crystal silicon having the lateral isolation region defining the central part of the solid substrate;

masking and etching the central part to form the recess therein having the bottom wall, the first pair of opposed parallel sidewalls, and the second pair of opposed parallel sidewalls;

treating the bottom wall of the recess to increase the silicon oxidation rate thereof;

forming, on the bottom wall and the opposed parallel sidewalls of the second pair, a silicon oxide layer which is thicker on the bottom wall than on the opposed sidewalls; and isotropically etching the silicon oxide layer to remove the silicon oxide layer from the opposed parallel sidewalls of the second pair, while leaving the silicon oxide layer on the bottom wall of the recess.

14. A method according to claim 13 wherein treating the bottom wall comprises vertically implanting a dopant which accelerates the oxidation of the single-crystal silicon.

15. A method according to claim 14 wherein the dopant comprises one of Si, In, As, and $BF_2$.

16. A method according to claim 9 wherein providing the substrate comprises:

forming an SOI substrate comprising a stack including a lower layer of single-crystal silicon, a silicon oxide interlayer, and an upper layer having the central part of single-crystal silicon bounded by the lateral isolation region;

forming a thin silicon oxide layer on the upper layer;

forming a mask on the thin silicon oxide layer;

etching, via the mask, the thin silicon oxide layer and the central part of the upper layer of the SOI substrate, stopping on the silicon oxide interlayer, to form the recess having the bottom wall made of silicon oxide, the first pair of opposed parallel sidewalls, and the second pair of opposed parallel sidewalls; and removing the mask.

17. A device comprising:

a substrate having a single-crystal silicon body and a lateral isolation region defining a central part in the body;

a recess in the central part of the body; and a network of single-crystal silicon parallel lines spaced apart and insulated from each other, each line of the network of single-crystal silicon parallel lines having a width from 5 to 20 nm.

18. A device according to claim 17, wherein the bottom wall is made of $SiO_2$.

19. A device according to claim 17 wherein the network of single-crystal silicon parallel lines is buried.

20. A device according to claim 17 wherein each line of the network of single-crystal silicon parallel lines is insulated from each other by one of a gaseous and solid dielectric material.

21. A semiconductor device comprising:

a substrate having a single-crystal silicon body and a lateral isolation region therein;

a recess in the body having a bottom defined by a bottom dielectric wall; and a network of single-crystal silicon parallel lines spaced apart and insulated from each other on the bottom dielectric wall, each line having a width less than 100 nm.

22. A device according to claim 21, wherein the dielectric bottom wall is made of $SiO_2$.

23. A device according to claim 21 wherein the network of single-crystal silicon parallel lines is buried.

24. A device according to claim 21 wherein each line of the network of single-crystal silicon parallel lines is insulated from each other by one of a gaseous and solid dielectric material.

25. A device according to claim 21 wherein each line of the network of single-crystal silicon parallel lines has a width from 5 to 20 nm.

* * * * *